United States Patent
Trinh et al.

(10) Patent No.: US 11,991,937 B2
(45) Date of Patent: May 21, 2024

(54) SEMICONDUCTOR DEVICE AND METHOD FOR MANUFACTURING THE SAME

(71) Applicant: TAIWAN SEMICONDUCTOR MANUFACTURING COMPANY LTD., Hsinchu (TW)

(72) Inventors: Hai-Dang Trinh, Hsinchu (TW); Hsing-Lien Lin, Hsin-Chu (TW); Fa-Shen Jiang, Taoyuan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/839,693

(22) Filed: Jun. 14, 2022

(65) Prior Publication Data
US 2022/0367806 A1    Nov. 17, 2022

Related U.S. Application Data

(62) Division of application No. 15/939,864, filed on Mar. 29, 2018, now Pat. No. 11,437,573.

(51) Int. Cl.
*H10N 70/20* (2023.01)
*H10N 70/00* (2023.01)

(52) U.S. Cl.
CPC ......... *H10N 70/245* (2023.02); *H10N 70/011* (2023.02); *H10N 70/24* (2023.02);
(Continued)

(58) Field of Classification Search
CPC ................ H10N 70/245; H10N 70/841
See application file for complete search history.

(56) References Cited

U.S. PATENT DOCUMENTS 8,866,122 B1 * 10/2014 Lee ............... H10N 70/245
257/4
9,799,705 B1 * 10/2017 Yi ................ H10N 70/841
(Continued)

FOREIGN PATENT DOCUMENTS

CN          106158899 A      11/2016

OTHER PUBLICATIONS

Office Action, Cited References and Search Report dated Sep. 28, 2022 issued by the China National Intellectual Property Administration for counterpart application No. 201811251089.3 (provided with translation).
(Continued)

*Primary Examiner* — Peter M Albrecht
(74) *Attorney, Agent, or Firm* — WPAT LAW; Anthony King

(57) ABSTRACT

A semiconductor device includes a bottom electrode, a top electrode over the bottom electrode, a switching layer between the bottom electrode and the top electrode, wherein the switching layer is configured to store data, a capping layer in contact with the switching layer, wherein the capping layer is configured to extract active metal ions from the switching layer, an ion reservoir region formed in the capping layer, a diffusion barrier layer between the bottom electrode and the switching layer, wherein the diffusion barrier layer includes palladium (Pd), cobalt (Co), or a combination thereof and is configured to obstruct diffusion of the active metal ions between the switching layer and the bottom electrode, and the diffusion layer has a concaved top surface, and a passivation layer covering a portion of the top electrode, and wherein the passivation layer directly contacts a top surface of the switching layer.

20 Claims, 19 Drawing Sheets

(52) U.S. Cl.
CPC ......... *H10N 70/826* (2023.02); *H10N 70/828* (2023.02); *H10N 70/8416* (2023.02)

(56) References Cited

U.S. PATENT DOCUMENTS

| | | | | |
|---|---|---|---|---|
| 2009/0218567 A1* | 9/2009 | Mathew | ............... | H10N 70/245 257/52 |
| 2011/0001116 A1* | 1/2011 | Greene | ................ | H10N 70/245 257/4 |
| 2012/0091420 A1* | 4/2012 | Kusai | ................... | H10N 70/245 257/4 |
| 2014/0203236 A1* | 7/2014 | Chen | ................... | H10N 70/245 257/4 |

OTHER PUBLICATIONS

Brief English translation of Office Action, Cited References and Search Report dated Sep. 28, 2022 issued by the China National Intellectual Property Administration for counterpart application No. 201811251089.3.
English abstract of CN106158899A.

* cited by examiner

SEMICONDUCTOR DEVICE AND METHOD FOR MANUFACTURING THE SAME

CROSS REFERENCE TO RELATED APPLICATIONS

This application is a divisional application of prior-filed U.S. application Ser. No. 15/939,864, filed Mar. 29, 2018.

BACKGROUND

Resistive random access memory (RRAM) and conductive bridge random access memory (CBRAM) are promising candidates for next generation non-volatile memory technology due to their simple structure and compatibility with complementary metal-oxide-semiconductor (CMOS) logic fabrication processes. The RRAM and CBRAM however, still suffer from degradation of switching window, switching time during cycling.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
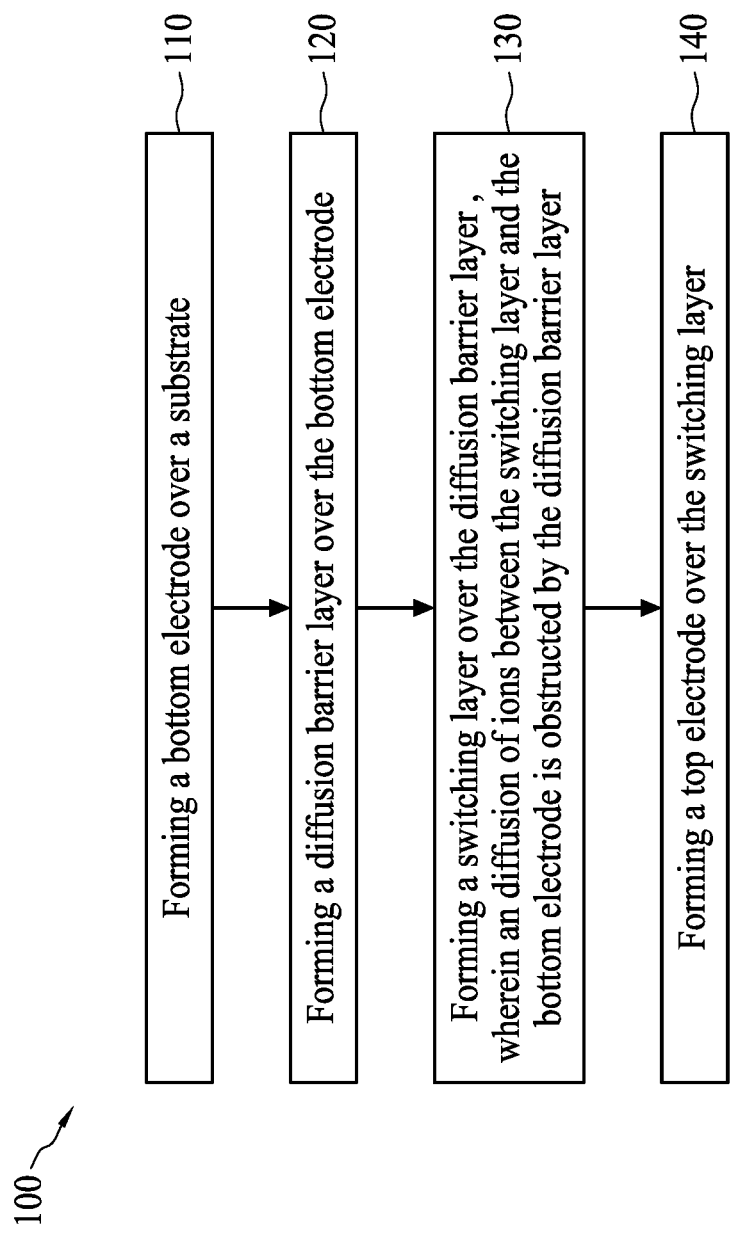
FIG. 1 is a flow chart illustrating a method for manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second," and "third" describe various elements, components, regions, layers and/or sections, these elements, components, regions, layers and/or sections should not be limited by these terms. These terms may be only used to distinguish one element, component, region, layer or section from another. The terms such as "first," "second," and "third" when used herein do not imply a sequence or order unless clearly indicated by the context.

As used herein, the terms "approximately," "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to ±0.05°.

In one or more embodiments of the present disclosure, a semiconductor device includes a diffusion barrier layer interposed between the bottom electrode and the switching layer. The material of the diffusion barrier layer is selected to be inert or less reactive with respect to ions such as oxygen ions or active ions, and thus the diffusion barrier layer can help to prevent or regard permeability of oxygen ions or active ions during cycling and baking. The diffusion barrier layer can improve the cycling and retention performance of semiconductor device. Accordingly, the switching window can be increased after cycling and baking.

FIG. 1 is a flow chart illustrating a method for manufacturing a semiconductor device according to various aspects of one or more embodiments of the present disclosure. The method 100 begins with operation 110 in which a bottom electrode is formed over a substrate. The method 100 proceeds with operation 120 in which a diffusion barrier layer is formed over the bottom electrode. The method 100 continues with operation 130 in which a switching layer is formed over the diffusion barrier layer. The diffusion of ions between the switching layer and the bottom electrode is obstructed by the diffusion barrier layer. The method 100 proceeds with operation 140 in which a top electrode is formed over the switching layer.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2:
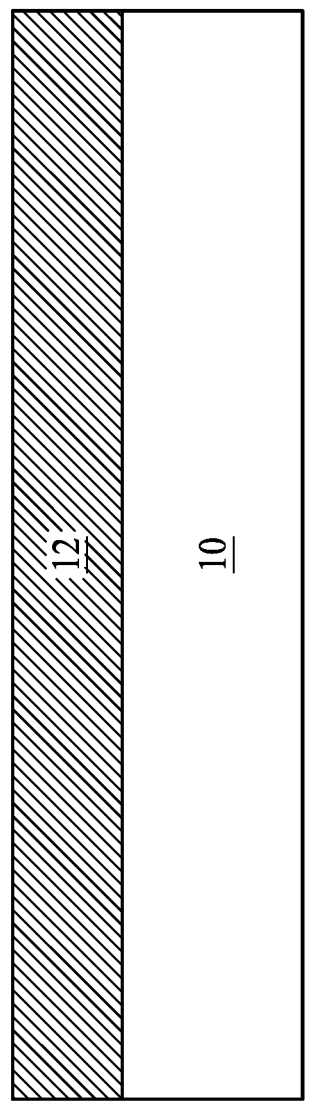
FIG. 2 and FIG. 3 are schematic views at one of various operations of manufacturing a semiconductor device according to one or more embodiments of the present disclosure.
Figure 3:
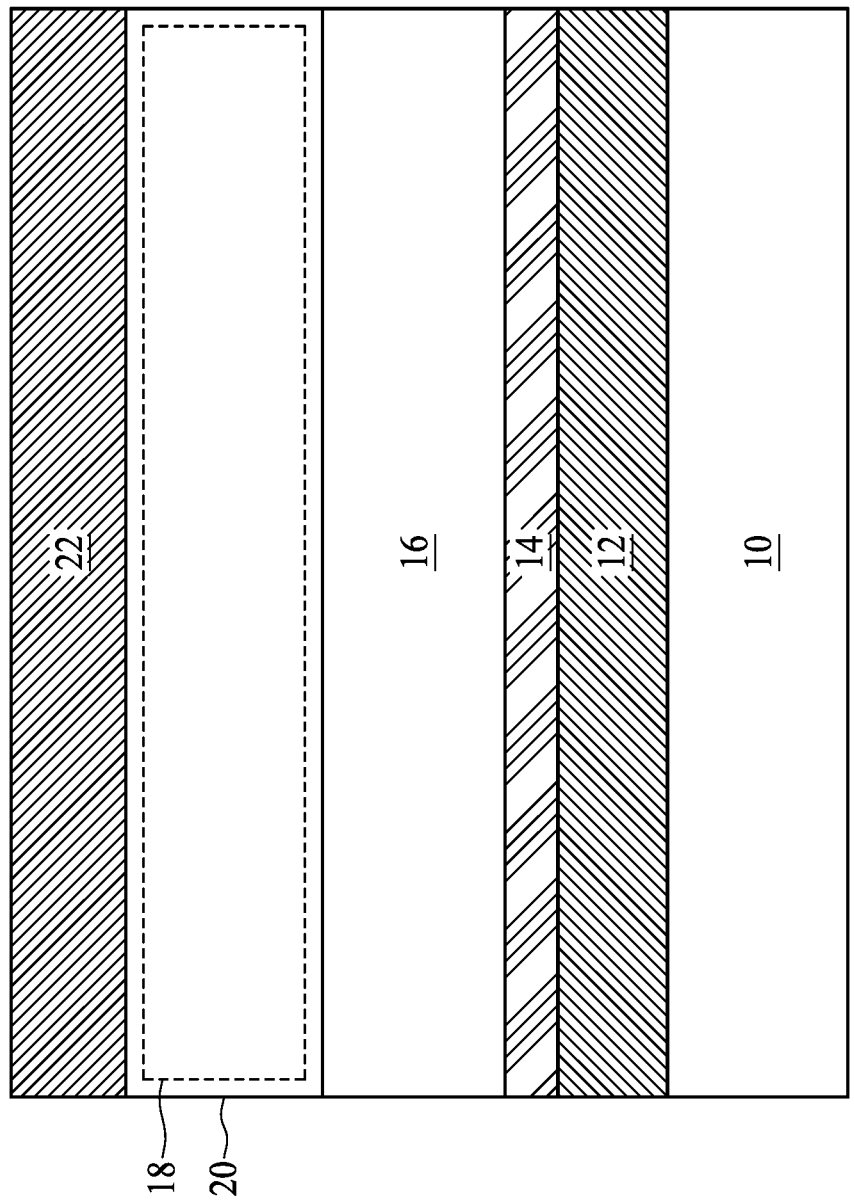

FIG. 2 and FIG. 3 are schematic views at one of various operations of manufacturing a semiconductor device according to one or more embodiments of the present disclosure. As shown in FIG. 2, a substrate 10 is received. The substrate 10 may include a semiconductor substrate. In some embodiments, the material of the substrate 10 may include elementary semiconductor such as silicon or germanium; a compound semiconductor such as silicon germanium, silicon carbide, gallium arsenic, gallium phosphide, indium phosphide or indium arsenide; or combinations thereof.

In some embodiments, semiconductor components such as transistor components, electronic components such as resistor components, capacitor components, or inductor components, and circuit layers may be formed in or over the substrate 10.

As shown in FIG. 2, a bottom electrode 12 is formed over the substrate 10. The bottom electrode 12 is formed from a conductive material. Examples of the conductive material for the bottom electrode 12 may include, but are not limited to, metal nitride such as titanium nitride, tantalum nitride or the like, doped semiconductive material such as polycrystalline silicon or the like, and metal such as gold, tungsten or the like. In some embodiments, the bottom electrode 12 may be electrically connected to the semiconductor components, the electronic components and/or the circuit layers formed on the substrate 10.

As shown in FIG. 3, a switching layer 16 is formed over the bottom electrode 12. A top electrode 22 is formed over the switching layer 16. The switching layer 16 may include a data storage region configured to store data. In some embodiments, the switching layer 16 may be a data storage region of a resistive random access memory (RRAM). A variable resistance of the data storage region may represent a data unit, such as a bit of data. Depending on a voltage applied between the top electrode 22 and the bottom electrode 12, the variable resistance may be switched between a high resistance state and a low resistance state. In some embodiments, the switching layer 16 is, but not limited to be, a high-k dielectric material having a dielectric constant greater than 3.9. In some embodiments, the material of the switching layer 16 may include, but is not limited to, metal oxide. The metal oxide may include binary metal oxide such as hafnium oxide, tantalum oxide, aluminum oxide, nickel oxide, titanium oxide or the like. The metal oxide may include trinary metal oxide such as hafnium tantalum oxide, hafnium aluminum oxide, aluminum tantalum oxide or the like. In some embodiments, the material of the switching layer 16 may include, but is not limited to, semiconductive material such as amorphous silicon, germanium selenide, germanium telluride or the like.

The top electrode 22 is formed from a conductive material. Examples of the conductive material for the top electrode 22 may include, but are not limited to, doped semiconductive material such as polycrystalline silicon or the like, metal such as gold, tungsten, platinum, iridium, ruthenium or the like, metal nitride such as titanium nitride, tantalum nitride or the like.

In some embodiments, a capping layer 20 may be formed over the switching layer 16 prior to formation of the top electrode 22. In some embodiments, the material of the capping layer 20 may include, but is not limited to, metal such as titanium, tantalum, hafnium, aluminum or the like. In some embodiments, the metal of the capping layer 20 may extract ions such as oxygen from the switching layer 16, such that the capping layer 20 may include an ion reservoir region 18 with lower oxygen concentration than the switching layer 16. In some other embodiments, the material of the capping layer 20 may include, but is not limited to, a high k dielectric material having a dielectric constant greater than 3.9. For example, the material of the capping layer 20 may include metal oxide such as titanium oxide, tantalum oxide, hafnium oxide, aluminum oxide or the like. The oxygen concentration of the metal oxide of the capping layer 20 is lower than that of the switching layer 16, and thus can form an ion reservoir region 18 in the capping layer 20.

A diffusion barrier layer 14 is formed between the bottom electrode 12 and the switching layer 16 to form a semiconductor device 1 of some embodiments of the present disclosure. In some embodiments, the diffusion barrier layer 14 abuts the switching layer 16, e.g., the diffusion barrier layer 14 may be in contact with the switching layer 16. In some embodiments, the diffusion barrier layer 14 abuts the bottom electrode 12, e.g., the diffusion barrier layer 14 may be in contact with the bottom electrode 12. The diffusion barrier layer 14 may include an inert material or is less reactive to the ions than the bottom electrode 12, such that the diffusion barrier layer 14 may obstruct diffusion of ions between the switching layer 16 and the bottom electrode 12. In some embodiments, the thickness of the diffusion barrier layer 14 may be in a range between about 50 angstroms and about 300 angstroms, but is not limited thereto.

In some embodiments, the semiconductor device 1 may include a RRAM, which employs oxygen vacancies in the switching layer 16 to form conductive filaments. The ion reservoir region 18 may be configured as an oxygen reservoir region to store oxygen ions and facilitates resistance changes within the switching layer 16. In some embodiments, the diffusion barrier layer 14 may help to prevent oxygen ions from diffusion from the switching layer 16 into the diffusion barrier layer 14 and the bottom electrode 12, and may help to prevent oxygen ions from diffusion from the diffusion barrier layer 14 and the bottom electrode 12 into the switching layer 16. In some embodiments, the diffusion barrier layer 14 may help to retard diffusion of oxygen ions from the switching layer 16 into the diffusion barrier layer 14 and the bottom electrode 12, and may help to retard diffusion of oxygen ions from the diffusion barrier layer 14 and the bottom electrode 12 into the switching layer 16.

When the semiconductor device 1 is a resistive random access memory (RRAM), the diffusion barrier layer 14 is configured as an oxygen diffusion barrier layer. Examples of the material for the oxygen diffusion barrier layer may include metal, metal oxide, metal nitride, silicate, silicide, or a combination thereof. By way of examples, the metal for the oxygen diffusion barrier layer may include iridium (Ir), ruthenium (Ru), platinum (Pt) or a combination thereof. The metal oxide for the oxygen diffusion barrier layer may include iridium oxide, ruthenium oxide or a combination thereof. The metal nitride for the oxygen diffusion barrier layer may include ruthenium-titanium nitride. The silicate for the oxygen diffusion barrier layer may include tantalum-silicon-nitride. The silicide for the oxygen diffusion barrier layer may include tungsten silicide.

In some other embodiments, the semiconductor device 1 may include a conductive bridge random access memory (CBRAM), which employs active metal ions in the switching layer 16 to form conductive filaments. The ion reservoir region 18 may be configured as an active metal reservoir region to store active metal ions such as copper ions, silver ions, aluminum ions or the like. In some embodiments, the material of the capping layer 20 having the ion reservoir region 18 may include, but is not limited to, metal such as copper, silver, aluminum, nickel or the like, metal compound such as copper tantalum or the like, or metal compound such as copper tellurium or the like. The material of the switching layer 16 may include, but is not limited to, compounds such as ion compound, covalent compound, oxide compound, semiconductive material or the like. By way of example, the ion compound may include germanium sulfide (GeS), germanium antimony tellurium (GeSbTe) or the like. The covalent compound may include arsenic sulfide (AsS) or the like. The oxide compound may include tantalum oxide, silicon oxide, aluminum oxide, titanium oxide or the like. The semiconductive material may include amorphous silicon or the like.

In some embodiments, the diffusion barrier layer 14 may help to prevent metal ions such as copper ions, silver ions, aluminum ions or the like from diffusion from the switching layer 16 into the diffusion barrier layer 14 and the bottom electrode 12, and may help to prevent active metal ions from diffusion from the diffusion barrier layer 14 and the bottom electrode 12 into the switching layer 16. In some embodiments, the diffusion barrier layer 14 may help to retard diffusion of active metal ions from the switching layer 16 into the diffusion barrier layer 14 and the bottom electrode 12, and may help to retard diffusion of active metal ions from the diffusion barrier layer 14 and the bottom electrode 12 into the switching layer 16.

When the semiconductor device 1 is a CBRAM, the diffusion barrier layer 14 is configured as an active metal diffusion barrier layer. Examples of the material for the active metal diffusion barrier layer may include metal, metal nitride, metal alloy, or a combination thereof. By way of examples, the metal for the active metal diffusion barrier layer may include palladium (Pd), tantalum (Ta), hafnium (Hf), zirconium (Zr), niobium (Nb), cobalt (Co), ruthenium (Ru) or a combination thereof. The metal nitride for the active metal diffusion barrier layer may include titanium nitride, tantalum nitride, tungsten nitride, tantalum tungsten nitride, ruthenium titanium nitride, ruthenium tantalum nitride, tantalum silicon nitride, tantalum germanium oxynitride (Ta—Ge—(O)N) or a combination thereof. The metal alloy for the active metal diffusion barrier layer may include nickel chromium alloy.

After the semiconductor device 1 is fabricated, an initialization operation is performed. In case the semiconductor device 1 is an RRAM, the initialization operation can be performed to break the bonding between metal and oxygen, thereby forming oxygen vacancies, i.e. conductive filaments in the switching layer 16. In case the semiconductor device 1 is a CBRAM, the initialization operation can be performed to emigrate active metal ions from the ion reservoir region 18 to the switching layer 16, thereby forming metal-bridges, i.e. conductive filaments in the switching layer 16. The semiconductor device 1 may also undergo a baking operation to verity data retention at a high temperature. After the initialization operation, the semiconductor device 1 can be operated in a reset state or in a set state.

Figure 4A:
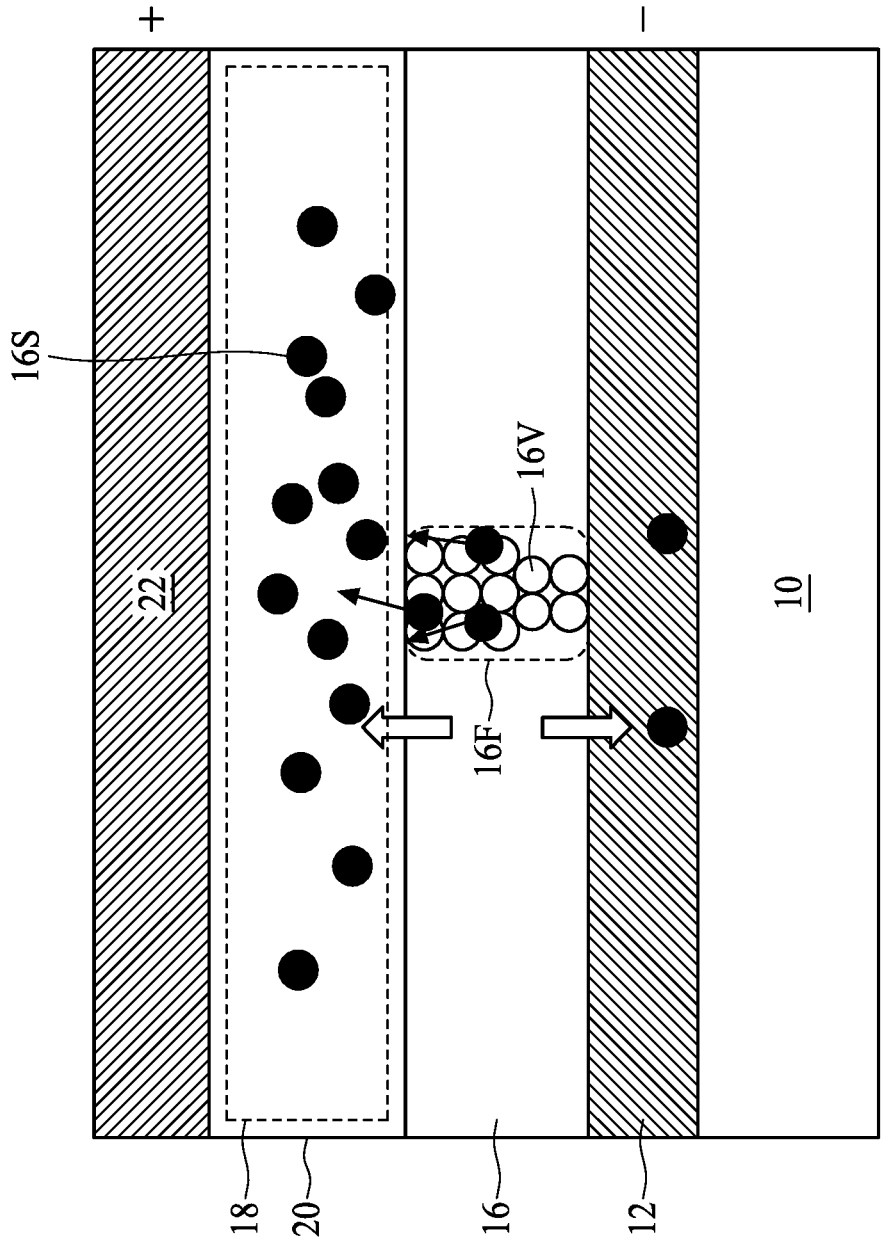
FIG. 4A, FIG. 4B and FIG. 4C are schematic diagrams illustrating different operational states of a semiconductor device 100, in accordance with some comparative embodiments of the present disclosure.
Figure 4B:
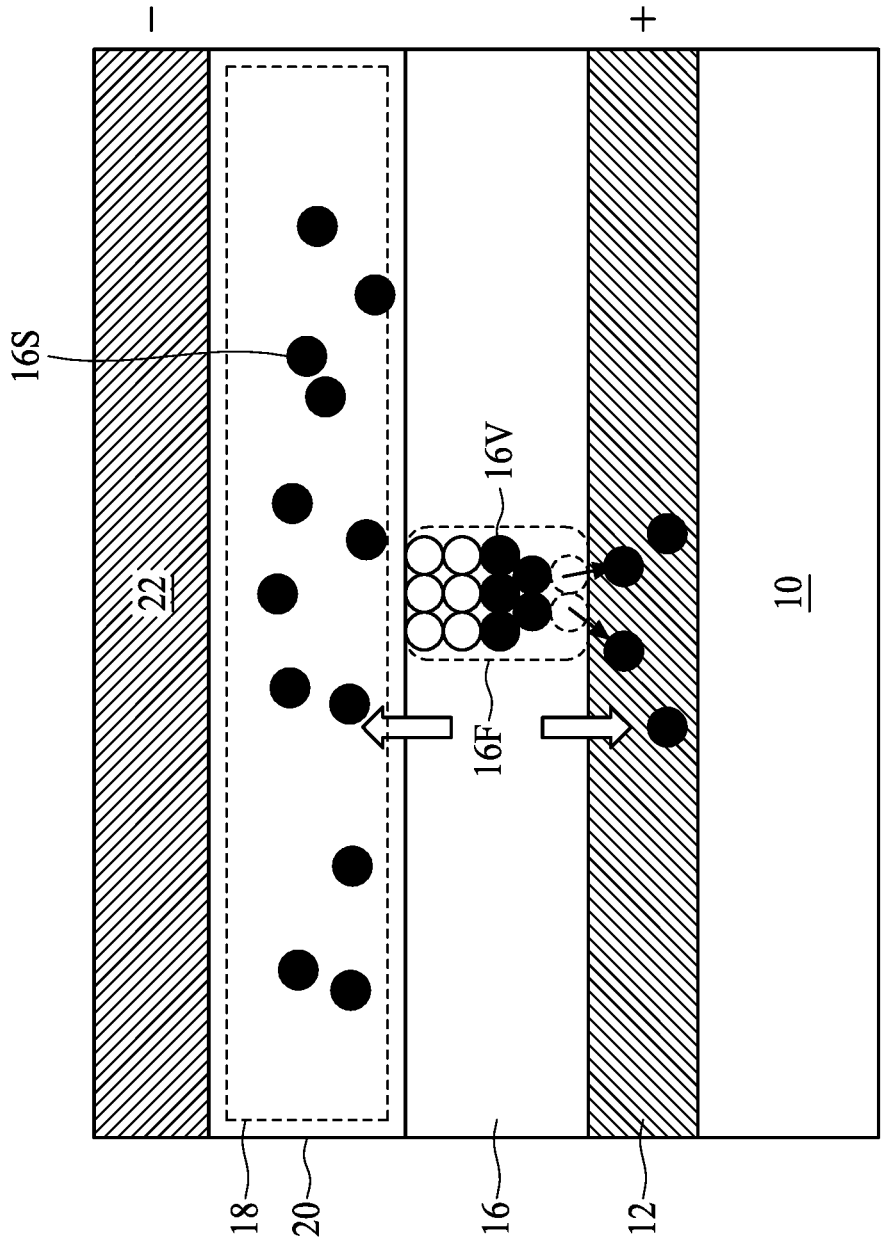
Figure 4C:
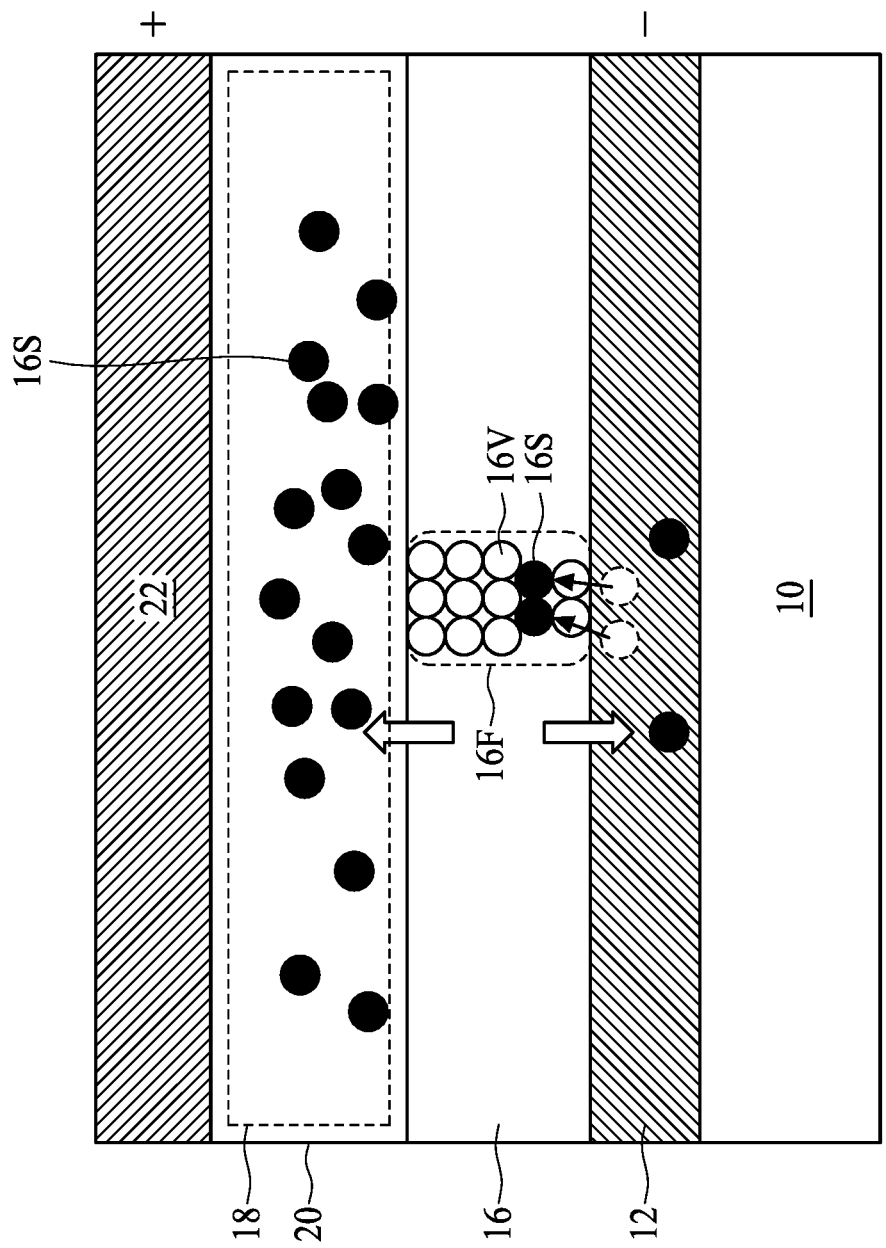

FIG. 4A, FIG. 4B and FIG. 4C are schematic diagrams illustrating different operational states of a semiconductor device 100, in accordance with some comparative embodiments of the present disclosure. As shown in FIG. 4A, an initialization operation is performed by applying a forming voltage across the top electrode 22 and the bottom electrode 12 to initially form the conductive filaments 16F. In some embodiments, the top electrode 22 is supplied with a positive voltage, and the bottom electrode 12 is supplied with a negative voltage. In case the semiconductor device 1 is an RRAM, the forming voltage is applied to break the bonding between metal and oxygen, thereby forming oxygen vacancies, i.e. conductive filaments in the switching layer 16. The localized vacancies 16V tend to align to form the conductive filaments 16F which may extend through the switching layer 16 and may be relatively permanent. In case the semiconductor device 1 is a CBRAM, the forming voltage is applied to make active metal ions emigrate from the ion reservoir region 18 to the switching layer 16, thereby forming metal-bridges, i.e. conductive filaments in the switching layer 16. During the initialization operation of a CBRAM, ions 16S may also diffuse into the bottom electrode 12.

As shown in FIG. 4B, a reset operation is performed by applying a reset voltage across the top electrode 22 and the bottom electrode 12 to switch the switching layer 16 from lower resistance state (LRS) to high resistance state (HRS). In some embodiments, the top electrode 22 is supplied with a negative voltage, and the bottom electrode 12 is supplied with a positive voltage. The ions 16S will move back from the ion reservoir region 18 to the switching layer 16, thereby filling vacancies 16V and breaking the conductive filaments 16F to increase resistivity. During the reset operation, some of the ions 16S may be diffused from the switching layer 16 to the bottom electrode 12, such that the conductive filaments 16F cannot be closed completely. In some embodiments, some of the ions 16S may also be diffused from the switching layer 16 to the bottom electrode 12 during a baking operation, thereby adversely affecting closing of the conductive filaments 16F.

As shown in FIG. 4C, a set operation is performed by applying a set voltage across the top electrode 22 and the bottom electrode 12 to switch the switching layer 16 from high resistance state (HRS) to lower resistance state (LRS). In some embodiments, the top electrode 22 is supplied with a positive voltage, and the bottom electrode 12 is supplied with a negative voltage. The ions 16S in the switching layer 16 will move to the ion reservoir region 18, thereby leaving vacancies 16V and re-forming conductive filaments 16F to lower resistivity. During the set operation, some of the ions 16S may be diffused from the bottom electrode 12 to the switching layer 16, such that the conductive filaments 16F cannot be open completely. In some embodiments, some of the ions 16S may also be diffused from the bottom electrode 12 to the switching layer 16 during a baking operation, thereby adversely affect opening of the conductive filaments 16F.

Figure 5A:
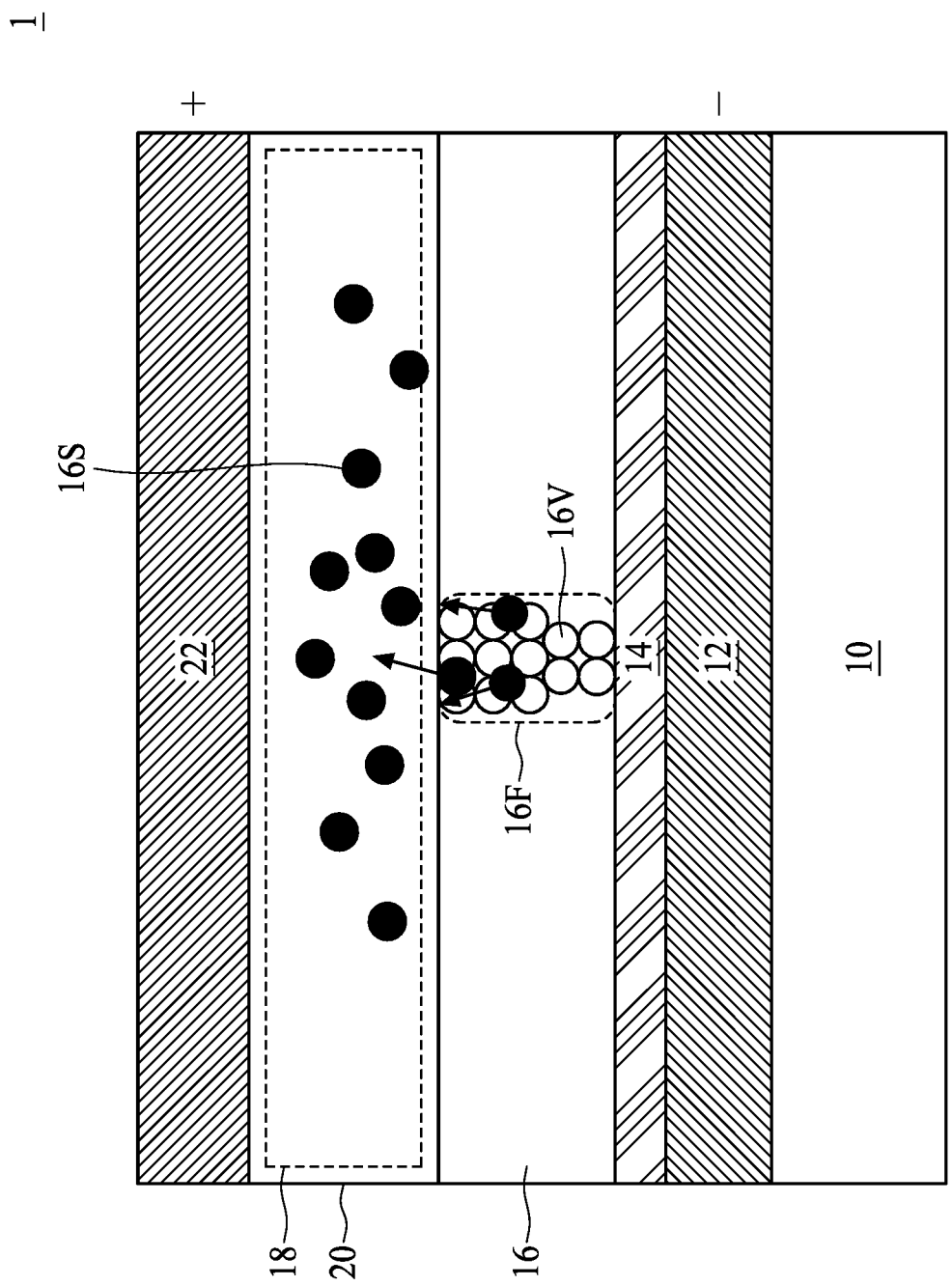
FIG. 5A, FIG. 5B and FIG. 5C are schematic diagrams illustrating different operational states of a semiconductor device 1, in accordance with some embodiments of the present disclosure.
Figure 5B:
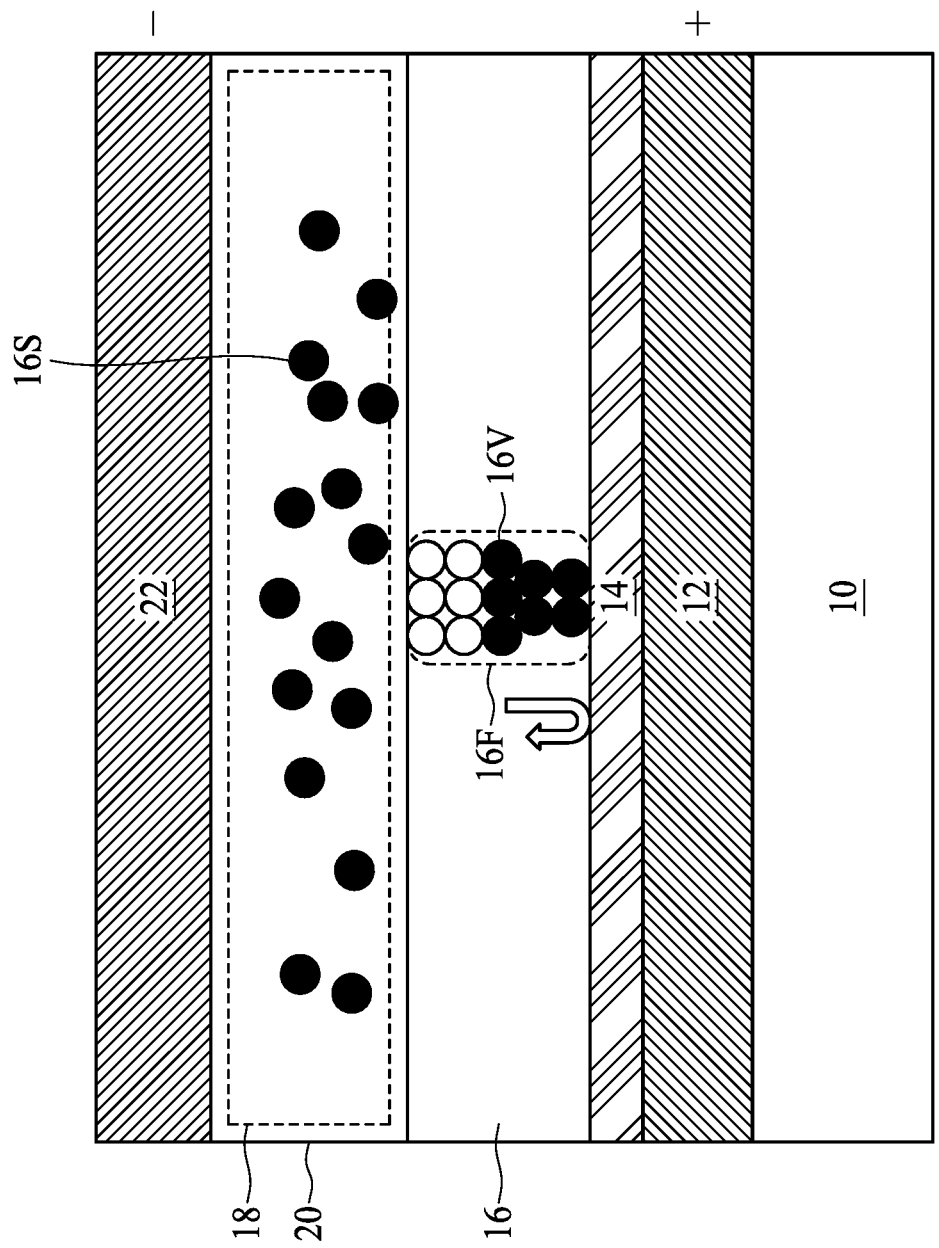
Figure 5C:
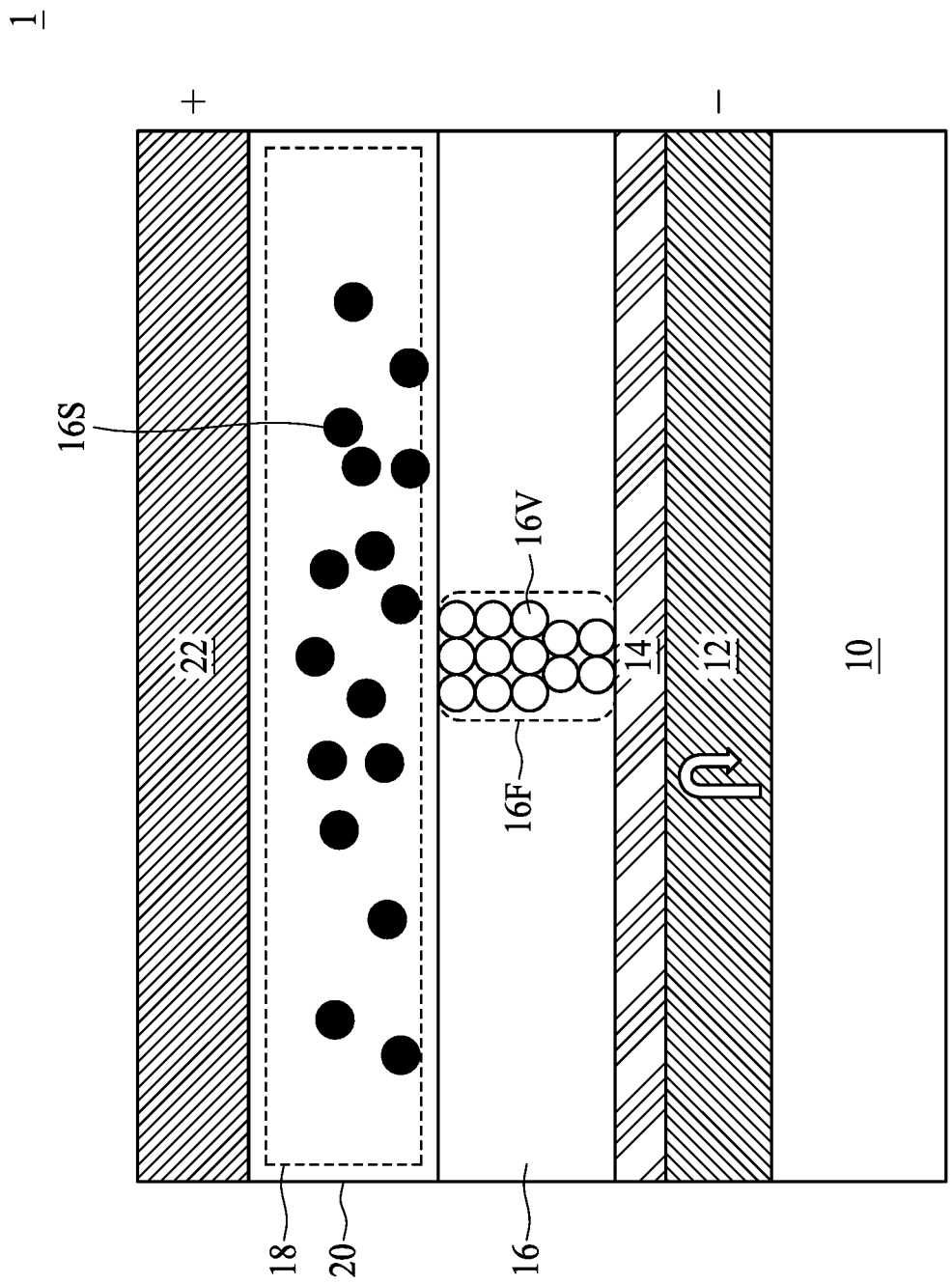

FIG. 5A, FIG. 5B and FIG. 5C are schematic diagrams illustrating different operational states of a semiconductor device 1, in accordance with some embodiments of the present disclosure. As shown in FIG. 5A, after the semiconductor device 1 is fabricated, an initialization operation is performed by applying a forming voltage across the top electrode 22 and the bottom electrode 12 to initially form the conductive filaments 16F. In some embodiments, the top electrode 22 is supplied with a positive voltage, and the bottom electrode 12 is supplied with a negative voltage. The forming voltage is applied to break the bonding between the atoms 16S and other element of the switching layer 16, thereby forming vacancies 16V in the switching layer 16, and driving ions 16S to the ion reservoir region 18. The localized vacancies 16V tend to align to form the conductive filaments 16F which may extend through the switching layer 16 and may be relatively permanent. During the initialization operation, the diffusion barrier layer 14, which is inert or less reactive to ions 16S than the bottom electrode 12 can help to prevent or retard diffusion of ions 16S from the switching layer 16 into the diffusion barrier layer 14 and the bottom electrode 12.

As shown in FIG. 5B, a reset operation is performed by applying a reset voltage across the top electrode 22 and the bottom electrode 12 to switch the switching layer 16 from LRS to HRS. In some embodiments, the top electrode 22 is supplied with a negative voltage, and the bottom electrode 12 is supplied with a positive voltage. The ions 16S will move back from the ion reservoir region 18 to the switching layer 16, thereby filling vacancies 16V and breaking the conductive filaments 16F to increase resistivity. During the reset operation, the diffusion barrier layer 14 can help to prevent or retard diffusion of ions 16S from the switching layer 16 into the diffusion barrier layer 14 and the bottom electrode 12. Thus, the diffusion barrier layer 14 can help to retain the ions 16S in the switching layer 16, such that the conductive filaments 16F can be closed more robustly in the reset state. During a baking operation, the diffusion barrier layer 14 can also help to prevent or retard diffusion of ions 16S from the switching layer 16 into the diffusion barrier layer 14 and the bottom electrode 12.

As shown in FIG. 5C, a set operation is performed by applying a set voltage across the top electrode 22 and the bottom electrode 12 to switch the switching layer 16 from HRS to LRS. In some embodiments, the top electrode 22 is supplied with a positive voltage, and the bottom electrode 12 is supplied with a negative voltage. The ions 16S in the switching layer 16 will move to the ion reservoir region 18, thereby leaving vacancies 16V and re-forming conductive filaments 16F to lower resistivity. During the set operation, the diffusion barrier layer 14 can help to prevent or retard diffusion of ions 16S from the bottom electrode 12 and the diffusion barrier layer 14 into the switching layer 16. Thus, the diffusion barrier layer 14 can help to block the ions 16S from diffusing into the switching layer 16 from the bottom electrode 12, such that the conductive filaments 16F can be open more robustly in the set state. During a baking operation, the diffusion barrier layer 14 can also help to prevent or retard diffusion of ions 16S from the bottom electrode 12 and the diffusion barrier layer 14 into the switching layer 16.

The semiconductor device and its manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 6A:
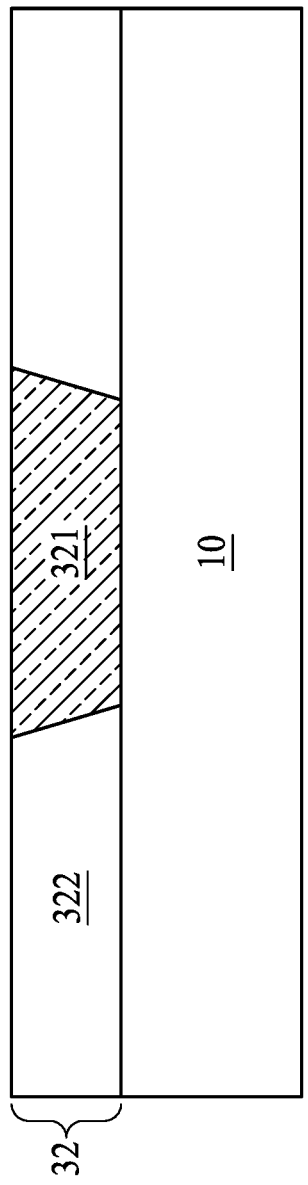
FIG. 6A, FIG. 6B, FIG. 6C, FIG. 6D, FIG. 6E, FIG. 6F and FIG. 6G are schematic views at one of various operations of manufacturing a semiconductor device according to one or more embodiments of the present disclosure.

FIG. 6A, FIG. 6B, FIG. 6C, FIG. 6D, FIG. 6E, FIG. 6F and FIG. 6G are schematic views at one of various operations of manufacturing a semiconductor device according to one or more embodiments of the present disclosure. As shown in FIG. 6A, a substrate 10 is received. In some embodiments, a bottom interconnect structure 32 may be formed over the substrate 10. In some embodiments, the bottom interconnect structure 32 includes a bottom metallization layer 321, and a bottom inter-layer dielectric (ILD) layer 322 laterally surrounding the bottom metallization layer 121. In some embodiments, the bottom metallization layer 321 may be one layer of the back-end-of-the line (BEOL). In some embodiments, the material of the bottom metallization layer 321 may include metal or alloy such as copper, tungsten, alloy thereof or the like. The material of the bottom ILD layer 322 may include dielectric material such as low-k dielectric material with a dielectric constant less than 2.0 or the like, but is not limited thereto.

Figure 6B:
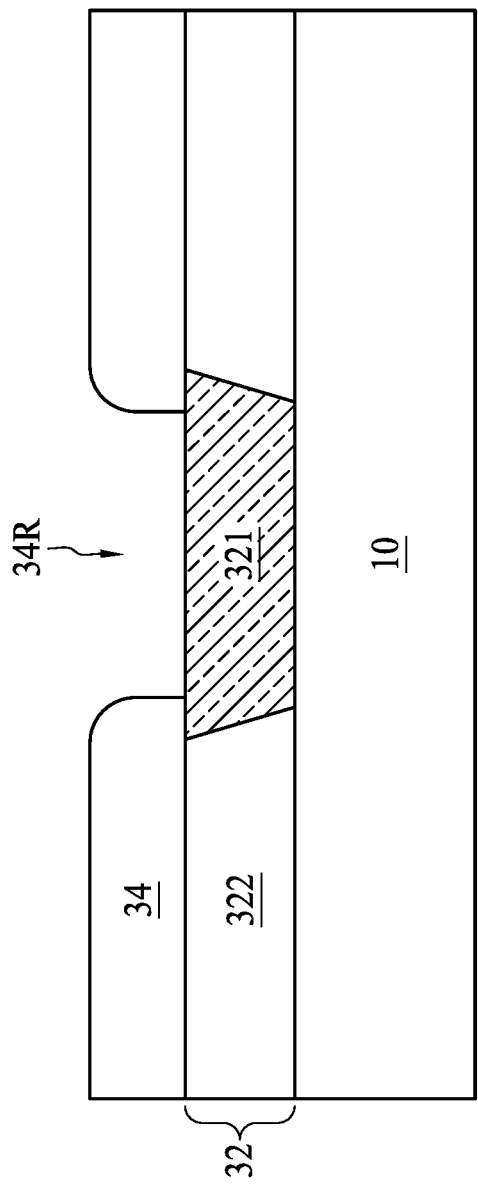

As shown in FIG. 6B, a dielectric layer 34 is formed over the substrate 10. In some embodiments, the dielectric layer 34 is formed over the bottom interconnect structure 32 and includes an opening 34R exposing a portion of the bottom metallization layer 321. In some embodiments, the material of the dielectric layer 34 may include dielectric material such as silicon oxide, silicon nitride, silicon oxynitride or the like.

Figure 6C:
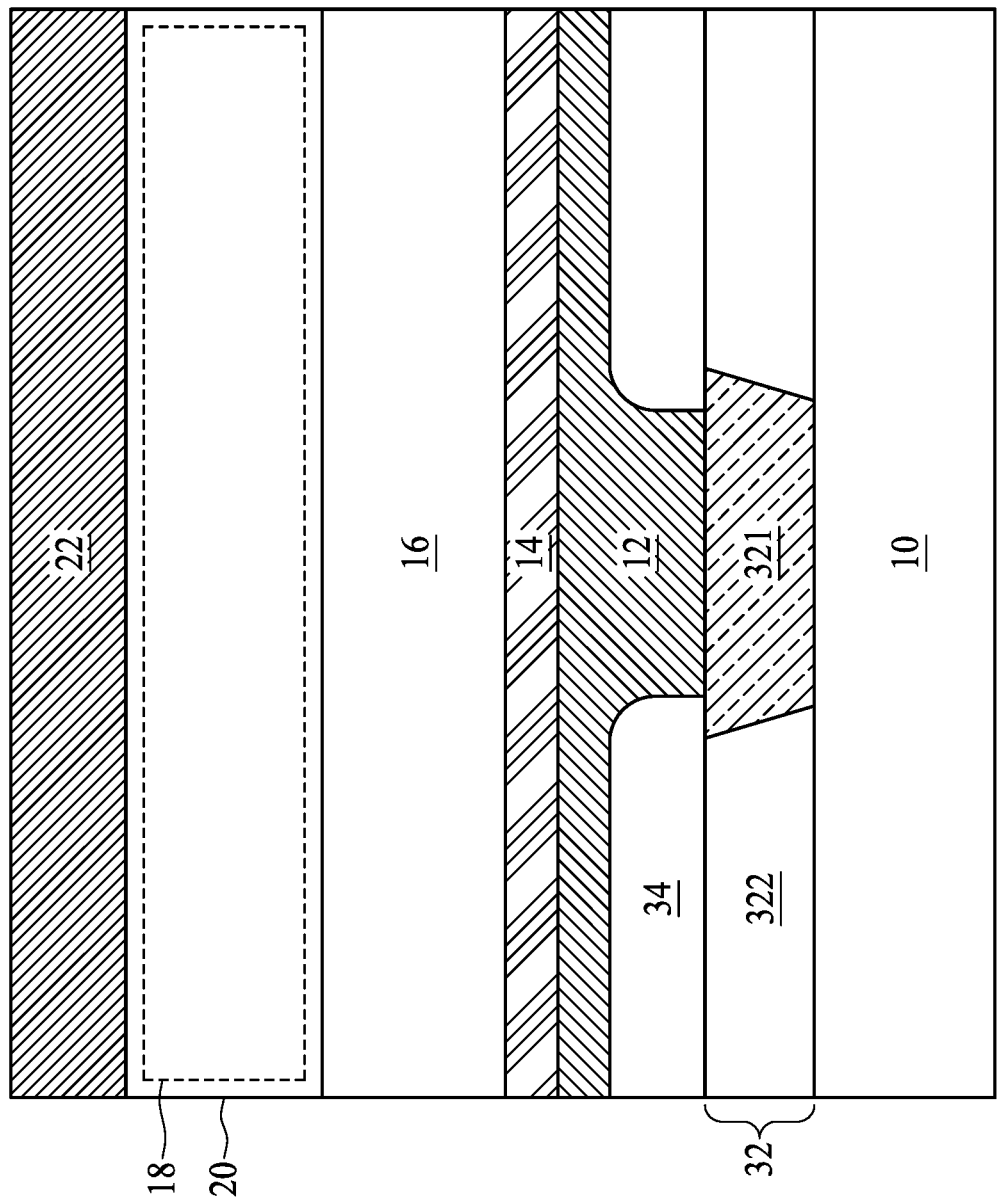

As shown in FIG. 6C, a bottom electrode 12 is formed over the dielectric layer 34, and electrically connected to the exposed bottom metallization layer 321. In some embodiments, the bottom electrode 12 may be formed to have a substantially planar upper surface. Subsequently, a diffusion barrier layer 14, a switching layer 16 and a top electrode 22 may be formed over the bottom electrode 12. In some embodiments, an ion reservoir region 18 may be formed over the switching layer 16 prior to formation of the top electrode 22. In some embodiments, a capping layer 20 may be formed over the ion reservoir region 18 prior to formation of the top electrode 22. The diffusion barrier layer 14, the switching layer 16, the ion reservoir region 18, the capping layer 20 and the top electrode 22 may have substantially planar upper surface as the bottom electrode 12. The materials for the bottom electrode 12, the diffusion barrier layer 14, the switching layer 16, the capping layer 20 and the top electrode 22 may be the same as the aforementioned embodiments, and are not redundantly described.

Figure 6D:
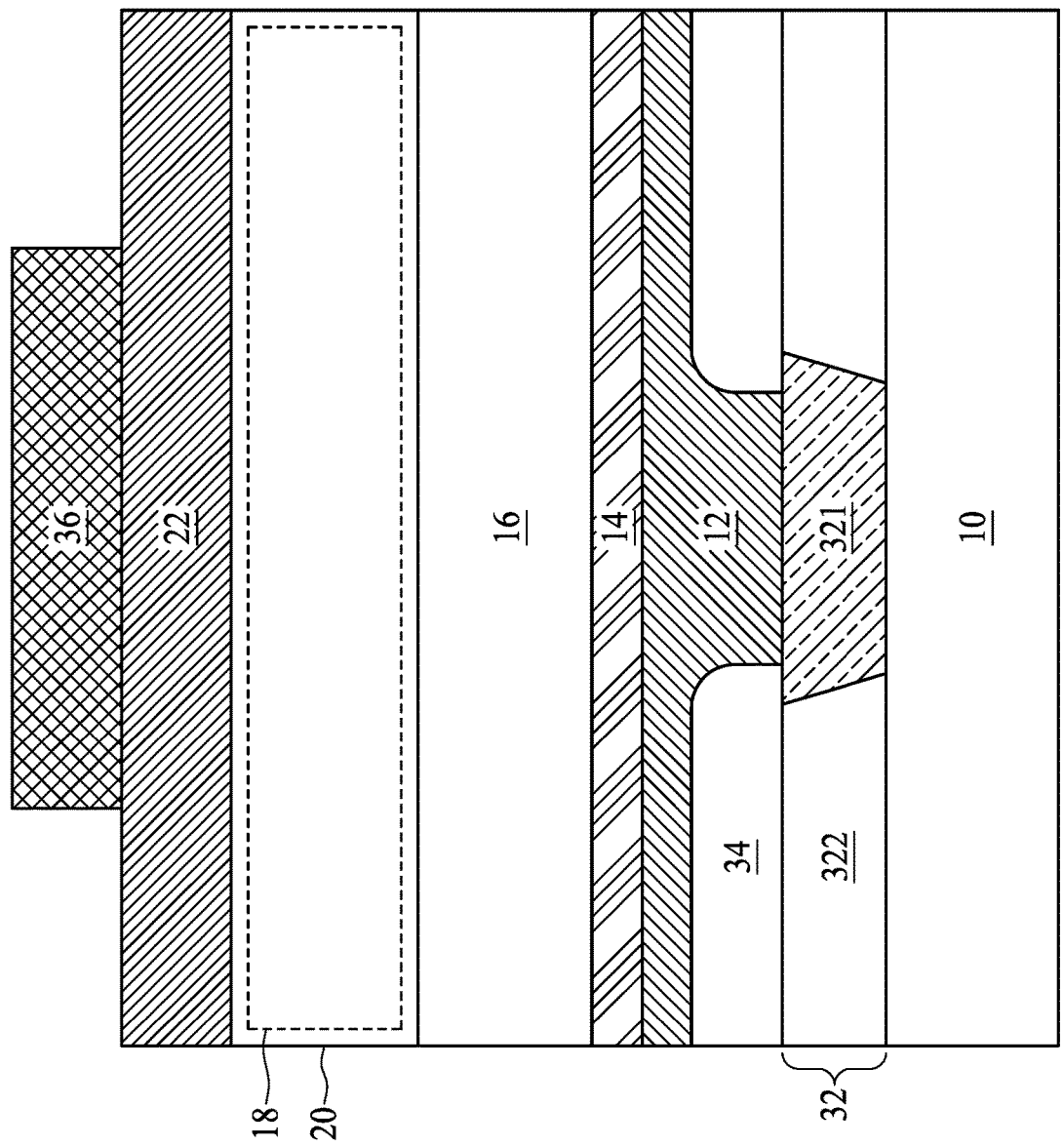

As shown in FIG. 6D, a mask layer 36 is formed over the top electrode 22. The mask layer 36 covers a portion of the top electrode 22, and exposes the rest of the top electrode 22. In some embodiments, the mask layer 36 may include a photoresist layer, but is not limited thereto.

Figure 6E:
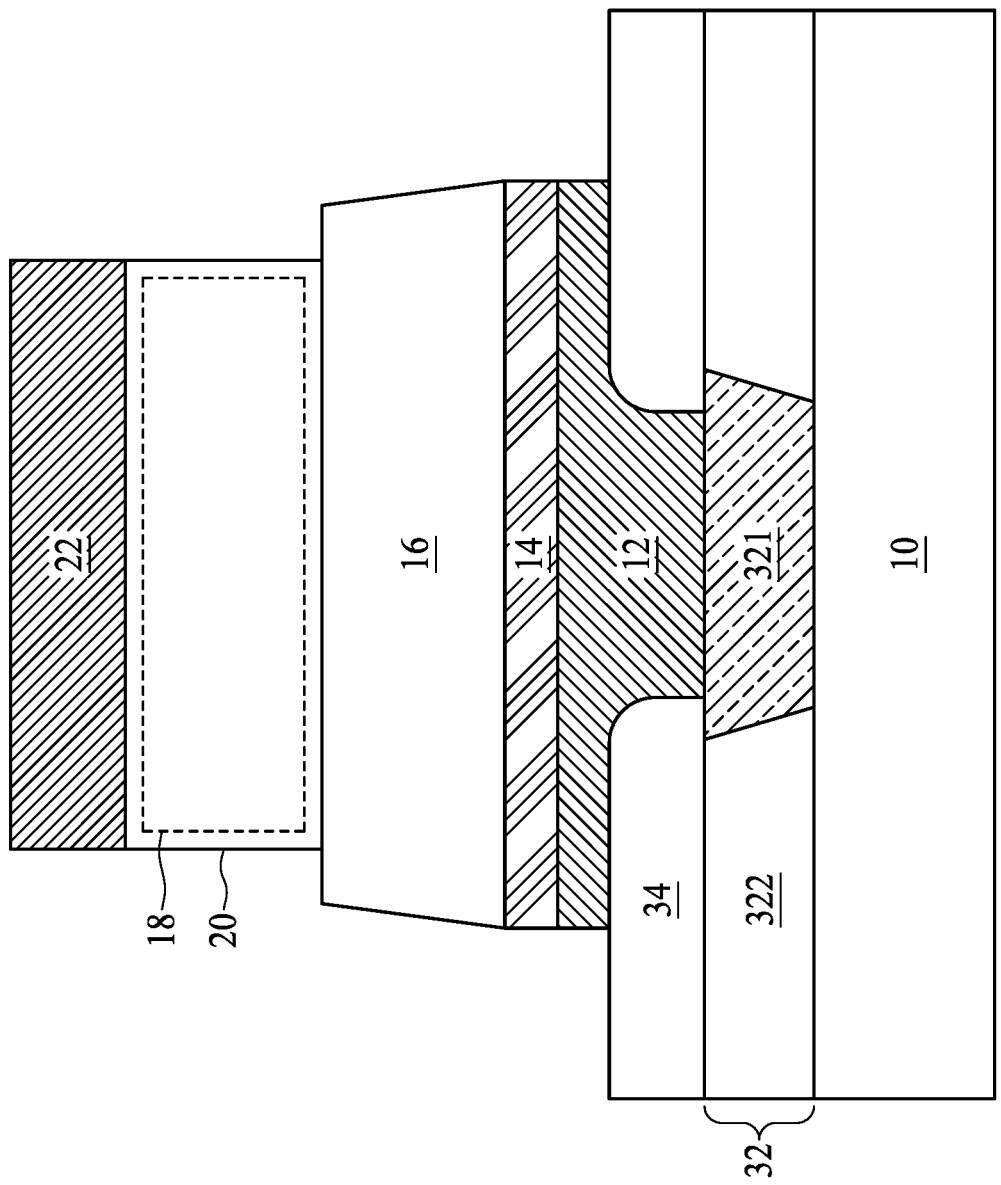

As shown in FIG. 6E, the top electrode 22, the capping layer 20, the ion reservoir region 18, the switching layer 16, the diffusion barrier layer 14 and the bottom electrode 12 are patterned. In some embodiments, the mask layer 36 is used as an etching mask to pattern the top electrode 22, the capping layer 20, the ion reservoir region 18, the switching layer 16, the diffusion barrier layer 14 and the bottom electrode 12. In some embodiments, the top electrode 22, the capping layer 20, the ion reservoir region 18, the switching layer 16, the diffusion barrier layer 14 and the bottom electrode 12 are patterned by etching. In some embodiments, the etching may include dry etching, wet etching or a combination thereof. The top electrode 22, the capping layer 20, the ion reservoir region 18, the switching layer 16, the diffusion barrier layer 14 and the bottom electrode 12 may be patterned by one etching operation, or multiple etching operations. In some embodiments, the width of the top electrode 22, the capping layer 20 and the ion reservoir region 18 may be smaller than that of the switching layer 16, the diffusion barrier layer 14 and the bottom electrode 12 after etching, and a portion of the upper surface of the switching layer 16 may be exposed. The mask layer 36 may be removed after the top electrode 22, the capping layer 20, the ion reservoir region 18, the switching layer 16, the diffusion barrier layer 14 and the bottom electrode 12 are patterned.

Figure 6F:
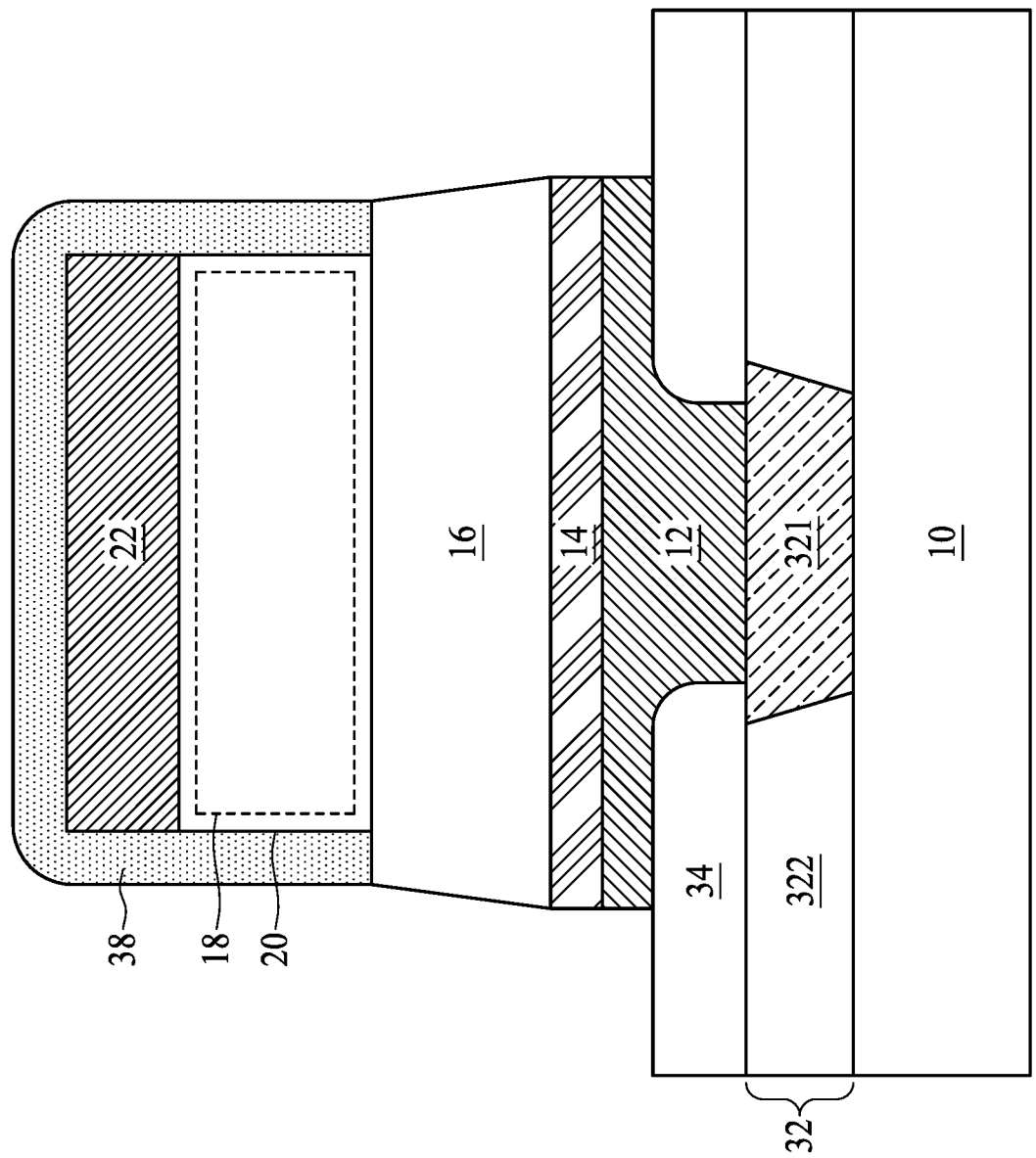

As shown in FIG. 6F, a passivation layer 38 can be optionally formed. In some embodiments, the passivation layer 36 is insulative. In some embodiments, the passivation layer 38 covers the upper surface of the top electrode 22. In some embodiments, the passivation layer 38 covers edges of the top electrode 22, the capping layer 20 and the ion reservoir region 18. In some embodiments, the passivation layer 38 further covers a portion of the switching layer 16. In some embodiments, the material of the passivation layer 38 includes dielectric material such as silicon oxide, silicon nitride, silicon oxynitride or the like, but is not limited thereto.

Figure 6G:
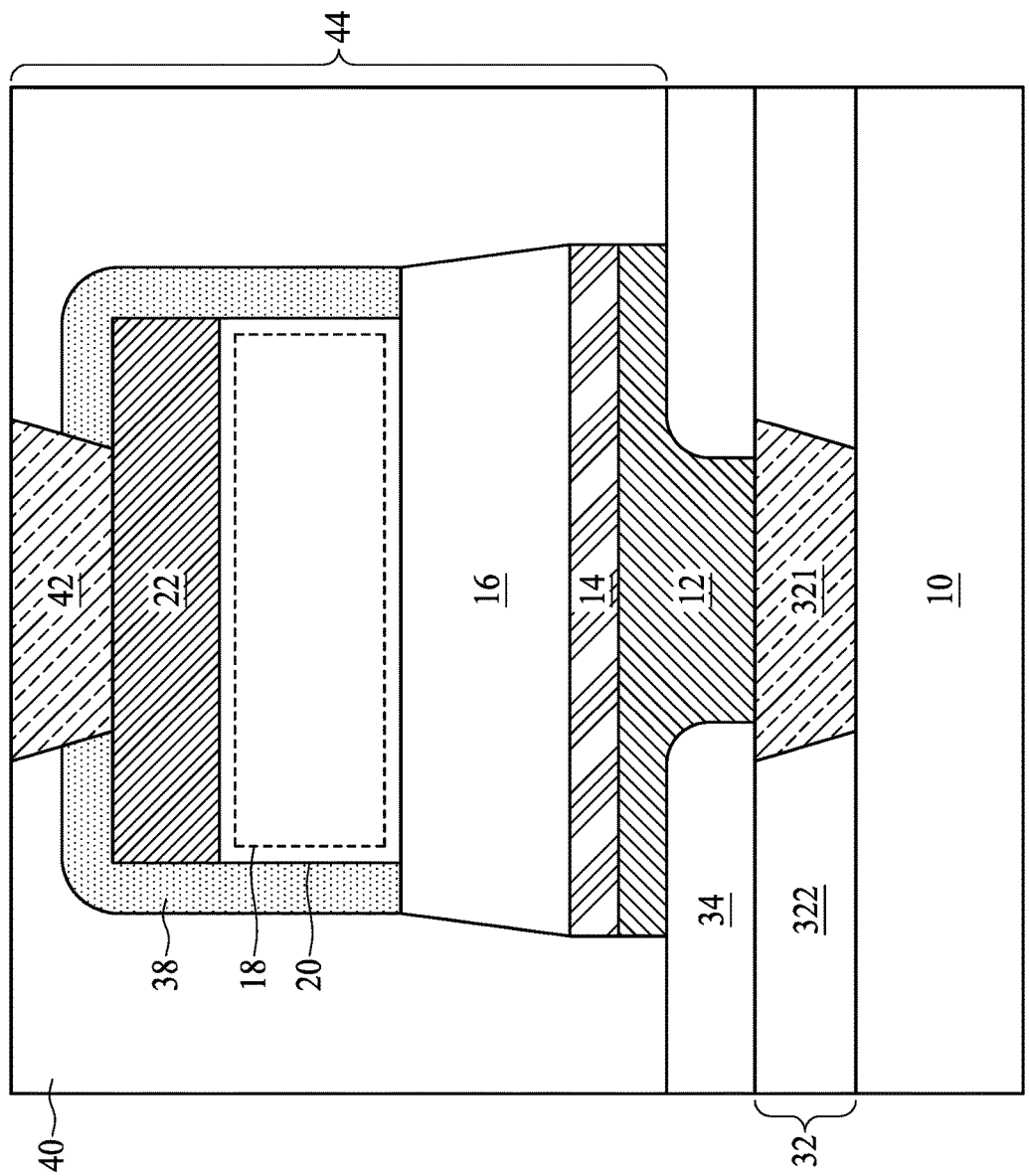

As shown in FIG. 6G, a top inter-layer dielectric (ILD) layer 40 is formed over the substrate 10, covering the passivation layer 36. In some embodiments, the material of the top ILD layer 322 may include dielectric material such as low-k dielectric material with a dielectric constant less than 2.0 or the like, but is not limited thereto. The top ILD layer 40 and the passivation layer 38 may be patterned by, e.g., photolithography and etching technique, to expose a portion of the top electrode 22. In some embodiments, a top metallization layer 42 is formed, and electrically connected to the top electrode 22 to form a semiconductor device 2. In some embodiments, the material of the top metallization layer 42 may include metal or alloy such as copper, tungsten, alloy thereof or the like. In some embodiments, the top metallization layer 42 and the top ILD layer 40 form a top interconnect structure 44. The semiconductor device 2 is a planar type semiconductor device, in which the top electrode 22, the capping layer 20, the ion reservoir region 18, the switching layer 16, the diffusion barrier layer 14 and the bottom electrode 12 may have planar upper surfaces.

In some embodiments, the semiconductor device 2 may be driven by a transistor device. By way of example, the bottom metallization layer 321 may be electrically connected to a drain electrode of a transistor device. The source electrode of the transistor device may be electrically connected to a source line, and the gate electrode of the transistor device may be electrically connected to a word line. The top metallization layer 42 may be electrically connected to a bit line.

In some embodiments, the semiconductor device 2 may be driven by a pair of transistor devices. By way of example, the bottom metallization layer 321 may be electrically connected to a common drain electrode of a transistor device. The source electrodes of the pair of transistor devices may be electrically connected to source lines, and the gate electrodes of the transistor device may be electrically connected to word lines. The top metallization layer 42 may be electrically connected to a bit line.

Figure 7:
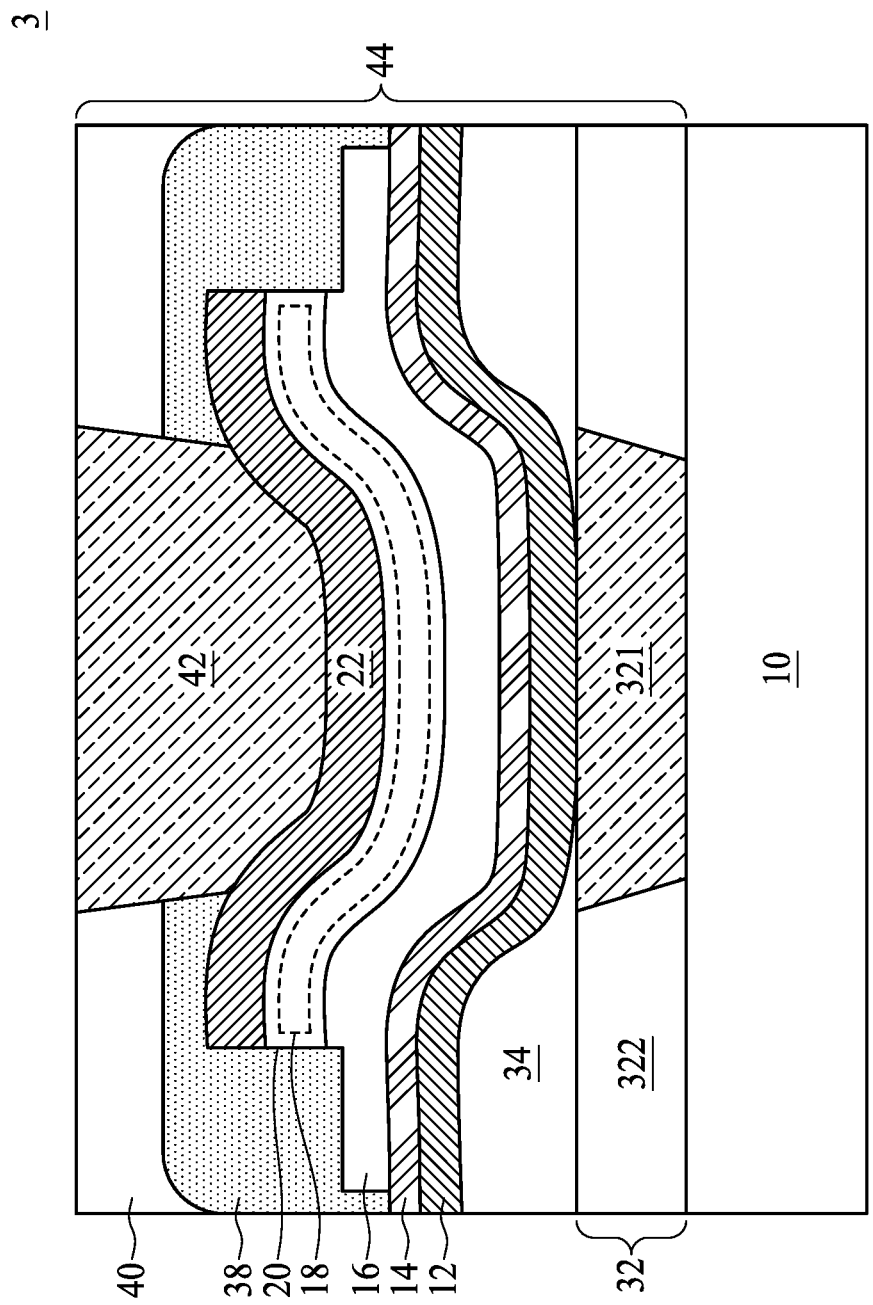
FIG. 7 is a schematic cross-sectional view of a semiconductor device according to some embodiments of the present disclosure.

FIG. 7 is a schematic cross-sectional view of a semiconductor device according to some embodiments of the present disclosure. As shown in FIG. 7, in contrast of the semiconductor device 2 of FIG. 6G, the semiconductor device 3 is a non-planar type semiconductor device, in which the upper surface of the bottom electrode 12 is recessed. In some embodiments, the upper surfaces of the top electrode 22, the capping layer 20, the switching layer 16 and the diffusion barrier layer 14 may be non-planar. For example, the upper surfaces of the top electrode 22, the capping layer 20, the switching layer 16 and the diffusion barrier layer 14 may be recessed.

Figure 8:
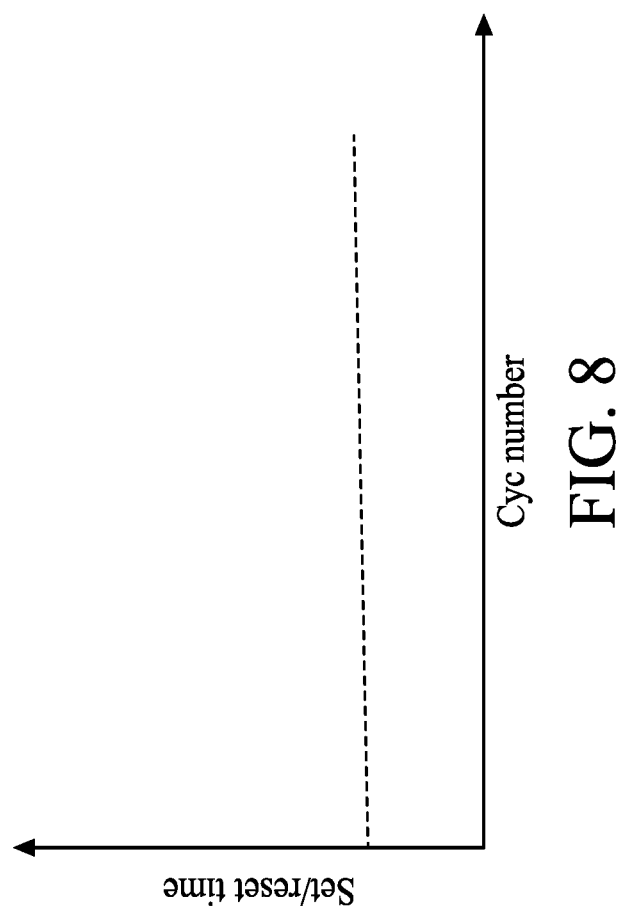
FIG. 8 is a plot illustrating a simulation result of set/reset time vs. cycle time relation in accordance with some embodiments of the present disclosure.

FIG. 8 is a plot illustrating a simulation result of set/reset time vs. cycle time relation in accordance with some embodiments of the present disclosure. As shown in FIG. 8, the degradation of set/reset time of the semiconductor device with the diffusion barrier layer is significantly addressed.

Figure 9:
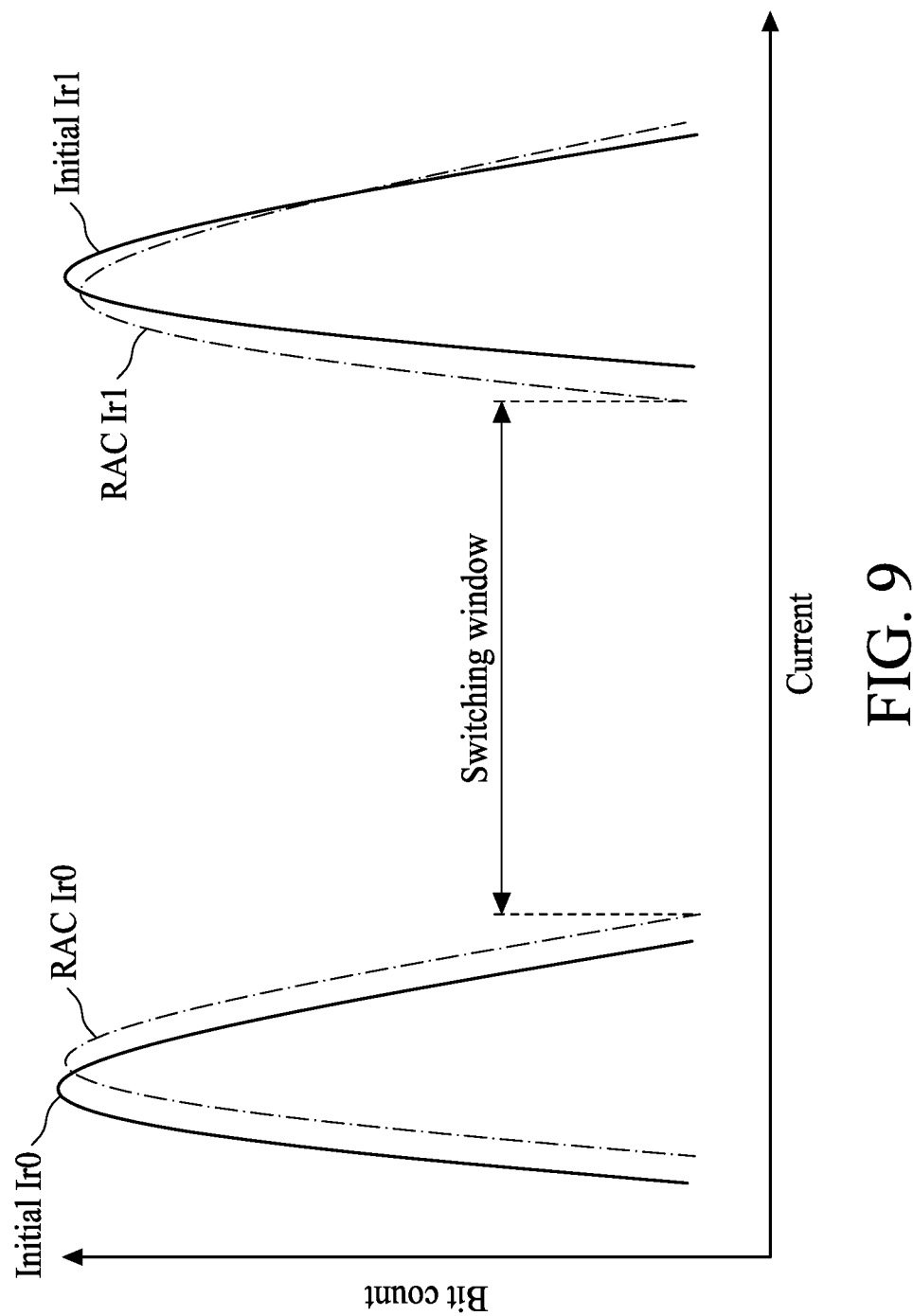
FIG. 9 is a plot illustrating a simulation result of bit count vs. current relation in accordance with some embodiments of the present disclosure.

FIG. 9 is a plot illustrating a simulation result of bit count vs. current relation in accordance with some embodiments of the present disclosure. As shown in FIG. 9, the switching window between the retention after cycling (RAC) Ir0 and Ir1 is close to the original switching window between the initial Ir0 and Ir1, thus the degradation of switching window of the semiconductor device with the diffusion barrier layer is significantly addressed.

In some embodiments of the present disclosure, the semiconductor device includes a diffusion barrier layer interposed between the bottom electrode and the switching layer. The material of the diffusion barrier layer is selected to be inert or less reactive with respect to ions such as oxygen ions or active ions, and thus the diffusion barrier layer can help to prevent or regard permeability of oxygen ions or active ions during cycling and baking. The diffusion barrier layer can improve the cycling and retention performance of semiconductor device.

In some embodiments, a semiconductor device includes a bottom electrode, a top electrode, a switching layer and a diffusion barrier layer. The top electrode is over the bottom electrode. The switching layer is between the bottom electrode and the top electrode, and configured to store data. The diffusion barrier layer is between the bottom electrode and the switching layer, and configured to obstruct diffusion of ions between the switching layer and the bottom electrode.

In some embodiments, a semiconductor device includes a bottom electrode, a top electrode, a switching layer and an oxygen diffusion barrier layer. The top electrode is over the bottom electrode. The switching layer is between the bottom electrode and the top electrode, and configured to store data. The oxygen reservoir layer is between the switching layer and the top electrode. The oxygen diffusion barrier layer is between the bottom electrode and the switching layer, wherein the oxygen barrier layer is configured to obstruct diffusion of oxygen ions between the switching layer and the bottom electrode.

In some embodiments, a method for manufacturing semiconductor device includes following operations. A bottom electrode is formed over a substrate. A diffusion barrier layer is formed over the bottom electrode. A switching layer is formed over the diffusion barrier layer. Diffusion of ions between the switching layer and the bottom electrode is obstructed by the diffusion barrier layer. A top electrode is formed over the switching layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a bottom electrode;
    a top electrode over the bottom electrode;
    a switching layer between the bottom electrode and the top electrode, wherein the switching layer is configured to store data;
    a capping layer in contact with the switching layer, wherein the capping layer is configured to extract active metal ions from the switching layer;
    an ion reservoir region formed in the capping layer;
    a diffusion barrier layer between the bottom electrode and the switching layer, wherein the diffusion barrier layer comprises palladium (Pd), cobalt (Co), or a combination thereof and is configured to obstruct diffusion of the active metal ions between the switching layer and the bottom electrode, and the diffusion barrier layer has a concaved top surface; and
    a passivation layer covering a portion of the top electrode, and wherein the passivation layer directly contacts a top surface of the switching layer,
    wherein an upper surface of the bottom electrode has a recess, and the bottom electrode includes an outer portion and an inner portion surrounded by the outer portion, and a lowermost surface of the outer portion is above a top surface of the inner portion.

2. The semiconductor device of claim 1, wherein a material of the switching layer comprises an ion compound, a covalent compound, an oxide compound, or a semiconductive material.

3. The semiconductor device of claim 2, wherein the ion compound comprises germanium sulfide (GeS) or germanium antimony tellurium (GeSbTe), the covalent compound comprises arsenic sulfide (AsS), the oxide compound comprises tantalum oxide, silicon oxide, aluminum oxide or titanium oxide, and the semiconductive material comprises amorphous silicon.

4. The semiconductor device of claim 1, wherein a material of the capping layer comprises a metal or a metal compound, wherein the metal comprises copper, silver, aluminum or nickel, and the metal compound comprises copper tantalum or copper tellurium.

5. The semiconductor device of claim 1, wherein the passivation layer covers an upper surface and edges of the top electrode.

6. The semiconductor device of claim 1, wherein the passivation layer is in direct contact with the top electrode, the capping layer, the switching layer, and the diffusion barrier layer.

7. The semiconductor device of claim 1, wherein the passivation layer is in direct contact with a portion of the diffusion barrier layer.

8. The semiconductor device of claim 1, wherein the diffusion barrier layer further comprises a metal nitride or a metal alloy.

9. The semiconductor device of claim 8, wherein the metal nitride comprises tungsten nitride, tantalum tungsten nitride, ruthenium tantalum nitride, tantalum germanium oxynitride (Ta—Ge—(O)N) or a combination thereof, and the metal alloy comprises nickel chromium alloy.

10. A semiconductor device, comprising:
    a bottom electrode;
    a top electrode over the bottom electrode;
    a switching layer between the bottom electrode and the top electrode, wherein the switching layer is configured to store data;
    a capping layer abutting the switching layer and the top electrode;
    a diffusion barrier layer, wherein the diffusion barrier layer is less reactive to active metal ions than the bottom electrode, and a bottom surface of the diffusion barrier layer is in physical contact with a top surface of the bottom electrode, and wherein the diffusion barrier layer comprises tungsten nitride, tantalum tungsten nitride, tantalum germanium oxynitride (Ta—Ge—(O)N) or a combination thereof, the diffusion barrier layer is configured to obstruct diffusion of the active metal ions between the switching layer and the bottom electrode, and the diffusion barrier layer has a concaved top surface; and
    a passivation layer covering a portion of the top electrode, wherein the passivation layer directly contacts a top surface of the switching layer,
    wherein an upper surface of the bottom electrode has a recess, and the bottom electrode includes an outer portion and an inner portion surrounded by the outer portion, and a lowermost surface of the outer portion is above a top surface of the inner portion.

11. The semiconductor device of claim 10, wherein a material of the switching layer comprises an ion compound, a covalent compound, an oxide compound, or a semiconductive material, wherein the ion compound comprises germanium sulfide (GeS) or germanium antimony tellurium (GeSbTe), the covalent compound comprises arsenic sulfide (AsS), the oxide compound comprises tantalum oxide, silicon oxide, aluminum oxide or titanium oxide, and the semiconductive material comprises amorphous silicon.

12. The semiconductor device of claim 10, wherein the diffusion barrier layer further comprises a metal, a metal alloy or a combination thereof.

13. The semiconductor device of claim 12, wherein the metal comprises palladium (Pd), tantalum (Ta), niobium (Nb), cobalt (Co), ruthenium (Ru) or a combination thereof.

14. The semiconductor device of claim 12, wherein the metal alloy comprises nickel chromium alloy.

15. The semiconductor device of claim 10, wherein a material of the capping layer comprises a metal or a metal compound, wherein the metal comprises copper, silver, aluminum or nickel, and the metal compound comprises copper tantalum or copper tellurium.

16. A semiconductor device, comprising:
    a substrate;
    a metallization layer over the substrate;
    a bottom electrode, including a metal nitride or a doped semiconductive material;
    a top electrode, over the bottom electrode;
    a switching layer, between the bottom electrode and the top electrode, and configured to store data;
    a capping layer in contact with the switching layer, wherein the capping layer is configured to extract active metal ions from the switching layer;
    an ion reservoir region formed in the capping layer;
    a diffusion barrier layer, between the bottom electrode and the switching layer, wherein the diffusion barrier layer comprises tungsten nitride, tantalum tungsten nitride, tantalum germanium oxynitride (Ta—Ge—(O)N) or a combination thereof, the diffusion barrier layer is configured to obstruct diffusion of the active metal ions between the switching layer and the bottom electrode, and the diffusion barrier layer has a concaved top surface; and a passivation layer, covering a portion of the top electrode, wherein the bottom electrode comprises:

an inner portion between a lowermost surface of the diffusion barrier layer and a top surface of the metallization layer; and an outer portion, wherein a lowermost surface of the outer portion is above a top surface of the inner portion.

17. The semiconductor device of claim 16, wherein the passivation layer directly contacts a top surface of the switching layer.

18. The semiconductor device of claim 16, wherein a material of the switching layer comprises an ion compound, a covalent compound, an oxide compound, or a semiconductive material.

19. The semiconductor device of claim 18, wherein the ion compound comprises germanium sulfide (GeS) or germanium antimony tellurium (GeSbTe), the covalent compound comprises arsenic sulfide (AsS), the oxide compound comprises tantalum oxide, silicon oxide, aluminum oxide or titanium oxide, and the semiconductive material comprises amorphous silicon.

20. The semiconductor device of claim 16, wherein the diffusion barrier layer further comprises a metal, a metal alloy or a combination thereof.

* * * * *